United States Patent [19]

Imai et al.

[11] Patent Number: 5,476,754
[45] Date of Patent: Dec. 19, 1995

[54] PROCESS FOR PREPARING A LITHOGRAPHIC PRINTING PLATE

[75] Inventors: Masanori Imai; Ikuo Kawauchi, both of Shizuoka, Japan

[73] Assignee: Fuji Photo Film Co., Ltd., Minami-Ashigara, Japan

[21] Appl. No.: 388,576

[22] Filed: Feb. 14, 1995

Related U.S. Application Data

[62] Division of Ser. No. 177,790, Jan. 5, 1994, abandoned, which is a continuation of Ser. No. 654,510, Feb. 13, 1991, abandoned.

[30] Foreign Application Priority Data

Feb. 19, 1990 [JP] Japan ..................... 2-37786

[51] Int. Cl.$^6$ ........................................ G03F 7/32
[52] U.S. Cl. .................. 430/302; 430/325; 430/326; 430/331
[58] Field of Search ................... 430/325, 326, 430/330, 302, 331

[56] References Cited

U.S. PATENT DOCUMENTS

| | | | |
|---|---|---|---|
| 2,063,631 | 12/1936 | Schmidt et al. | 430/175 |
| 2,679,498 | 5/1954 | Seven et al. | 430/175 |
| 3,867,147 | 2/1975 | Teuscher. | |
| 4,079,041 | 3/1978 | Baumann et al.. | |
| 4,107,174 | 8/1978 | Baumann et al.. | |
| 4,845,009 | 7/1989 | Kita et al. | 430/176 |
| 4,956,261 | 9/1990 | Pawlowski et al. | 430/156 |

FOREIGN PATENT DOCUMENTS

| | | |
|---|---|---|
| 3633456 | 4/1987 | Germany. |
| 1102457 | 4/1989 | Japan. |
| 1254949 | 10/1989 | Japan. |

OTHER PUBLICATIONS

Patent Abstracts of Japan, vol. 13, No. 342, Aug. 2, 1989, p. 908.
Patent Abstracts of Japan, vol. 13, No. 1, Jan. 8, 1990, p. 985.

*Primary Examiner*—Charles L. Bowers, Jr.
*Assistant Examiner*—Christopher G. Young
*Attorney, Agent, or Firm*—Burns, Doane, Swecker & Mathis

[57] ABSTRACT

A presensitized plate comprises a substrate having a hydrophilic surface provided thereon with a light-sensitive layer containing an alkaline water-soluble or swellable photocrosslinkable polymer carrying photodimerizable unsaturated double bonds and an optional intermediate layer between the substrate and the light-sensitive layer wherein the light-sensitive layer and/or the intermediate layer contain a co-polycondensed diazo resin having, as the structural units, those derived from an aromatic compound having at least one carboxyl group and an aromatic diazonium compound, for instance 4-diazodiphenylamine salt. The light-sensitive layer and/or the intermediate layer of the plate exhibit high adhesion to the substrate or the like while maintaining high sensitivity and excellent quality thereof and the plate can be developed with an alkaline water to provide lithographic printing plates having excellent quality such as printing durability.

24 Claims, No Drawings

PROCESS FOR PREPARING A LITHOGRAPHIC PRINTING PLATE

This application is a divisional of application Ser. No. 08/177,790, filed Jan. 5, 1994, which is a continuation of application Ser. No. 07/654,510, filed on Feb. 13, 1991 now both abandoned.

BACKGROUND OF THE INVENTION

The present invention relates to a presensitized plate for use in making a lithographic printing plate (hereunder referred to as "PS plate") and more specifically to a PS plate provided with a light-sensitive layer comprising an alkaline water-soluble or swellable photocrosslinkable polymer, in which the adhesion of the light-sensitive layer to a substrate having a hydrophilic surface is improved.

There have been well-known photocrosslinkable materials capable of causing crosslinking through a cyclization reaction and these materials have widely been employed as a principal ingredient of a light-sensitive composition for preparing PS plates or the like. As such photocrosslinkable polymers, useful are, for instance, polymers carrying maleimido groups on the side chains and polymers carrying, on the side chains or in the main chain, groups having a photodimerizable unsaturated double bond adjacent to an aromatic nucleus such as cinnamyl group, cinnamoyl group, cinnamylidene group, cinnamylideneacetyl group and chalcone group and some of these have already been put into practical use. In particular, polymers having, on the side chains, maleimido groups and polyester resins which have, in the molecular chain, cinnamic acid skeleton and prepared by condensing phenylenediacrylic acid or an alkyl ester thereof with glycol have relatively high sensitivity.

In addition, it is preferable to use a developer free of an organic solvent from the viewpoint of safety of working environment. For this reason, it has been tried to make these polymers alkaline water-soluble. Examples of such polymers include copolymers of N-[2-(methacryloyloxy)ethyl]-2,3-dimethylmaleimide with methacrylic acid or acrylic acid as disclosed in Die Angewandte Makromolekulare Chemie, 1984, 128 ; and polymers having, on the side chains, photodimerizable functional groups and carboxyl groups as disclosed in Japanese Patent Unexamined Publication (hereunder referred to as "J.P. KOKAI") Nos. Sho 62-175729, Sho 62-175730, Sho 63-25443, Sho 63-218944 and Sho 63-218945.

However, these polymers do not have sufficient adhesion to an aluminum substrate and, therefore, they cannot be widely used for preparing light-sensitive layers of PS plates. In other words, they are greatly limited in applications. Thus, these light-sensitive polymers have not widely been used as a material for the light-sensitive layer of PS plates. If the adhesion of the light-sensitive layer to the substrate is low, PS plates which can provide lithographic printing plates having desired durability cannot be obtained. More specifically, images are liable to be peeled off when the plate is rubbed with a brush or the like during development and during printing operation. In particular, this tendency becomes conspicuous when the plate is lightly exposed to light and as a result, the sensitivity is impaired.

Some attempts have been made to eliminate this problem of low adhesion to a substrate. For instance, Japanese Patent Publication for Opposition Purpose (hereunder referred to as "J.P. KOKOKU") No. Sho 46-26521 discloses a substrate obtained by applying an anodized layer onto an aluminum substrate and then electrolyzing the layer in phosphoric acid electrolyte; J.P. KOKAI Nos. Sho 49-8428, Sho 49-12903 and Sho 50-138903 disclose aluminum substrates obtained by electrolyzing an aluminum plate in sulfuric acid electrolyte and etching the plate with phosphoric acid or polyphosphoric acid; and J.P. KOKAI No. Sho 49-93101 discloses the use of an aluminum substrate obtained by electrolyzing an aluminum plate in sulfuric acid electrolyte and then etching the plate with an alkaline solution. Alternatively, J.P. KOKOKU No. 50-7481(Brit. Pat. 1274017) and J.P. KOKAI No. Sho 62-78544(U.S. Pat. No. 4,845,009) disclose methods in which an underlying coating of a negative-working diazo resin is applied onto the surface of an aluminum substrate or a negative-working diazo resin is added to the light-sensitive layer.

However, in the techniques in which the adhesion of a light-sensitive layer to an oxidized layer of a substrate is enhanced according to a variety of treating methods, the adhesion of the oxidized layer to the light-sensitive layer becomes excessively high and the resulting non-image areas are liable to receive ink during printing and thus the resulting lithographic printing plate often causes background contamination. Moreover, in the foregoing techniques in which an underlying coating of a negative-working diazo resin is applied onto the surface of an aluminum substrate or a negative-working diazo resin is added to the light-sensitive layer, the diazo resin remains unremoved on the non-image areas even after the development since the resin is substantially insoluble in an alkaline developer. This likewise becomes a cause of background contamination during printing operation.

SUMMARY OF THE INVENTION

Accordingly, an object of the present invention is to provide a PS plate whose light-sensitive layer has excellent adhesion to the substrate while maintaining its excellent sensitivity and quality and which can be developed with an alkaline water and is capable of providing a lithographic printing plate having excellent printing properties such as printing durability.

Another object of the present invention is to provide a negative-working PS plate which can be developed with a developer for developing positive-working PS plates.

The inventors of this invention have conducted intensive studies to solve the foregoing problems associated with the conventional techniques, have found out that the foregoing objects of the present invention can effectively be achieved by incorporating a diazo resin having specific repeating units into a light-sensitive layer and/or an intermediate layer of a PS plate which comprises a substrate having a hydrophilic surface provided thereon with a light-sensitive layer containing an alkaline water-soluble or swellable photocrosslinkable polymer carrying photodimerizable unsaturated double bonds and an optional intermediate layer between the substrate and the light-sensitive layer, and have thus completed the present invention.

The present invention consequently relates to a PS plate which comprises a substrate having a hydrophilic surface provided thereon with a light-sensitive layer containing an alkaline water-soluble or swellable photocrosslinkable polymer carrying photodimerizable unsaturated double bonds and an optional intermediate layer between the substrate and the light-sensitive layer wherein the light-sensitive layer and/or the intermediate layer contains a co-polycondensed diazo resin having, as the structural units, those derived from an aromatic compound having at least one carboxyl group and an aromatic diazonium compound represented by the following general formula (I):

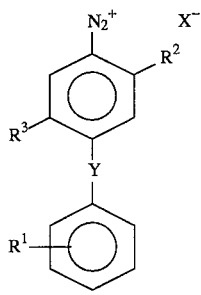

wherein $R^1$ represents a hydrogen atom, an alkyl group, an alkoxy group, a hydroxyl group, a carboxy ester group or a carboxyl group; $R^2$ and $R^3$ each represents a hydrogen atom, an alkyl group or an alkoxy group; $X^-$ represents an anion; and Y represents —NH—, —O— or —S—.

DESCRIPTION OF THE PREFERRED EMBODIMENTS

The PS plate of the present invention will hereunder be described in more detail.

As the photocrosslinkable polymers used in the present invention, there may be mentioned, for instance, those carrying, on the side chains or in the main chain, maleimido group, cinnamyl group, cinnamoyl group, cinnamylidene group, cinnamylideneacetyl group and/or chalcone group.

Examples of the polymers carrying maleimido groups on the side chains include those represented by the following general formula (A):

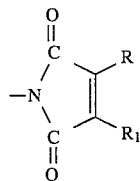

(wherein R and $R_1$ each independently represents an alkyl group having up to 4 carbon atoms or R and $R_1$ may be bonded together to form a 5- or 6-membered carbon ring) as disclosed in J.P. KOKAI No. Sho 52-988 (corresponding to U.S. Pat. No. 4,079,041), German Patent No. 2,626,769, European Patent Nos. 21,019 and 3,552 and Die Angewandte Makromolekulare Chemie, 1983, 115, pp. 163–181; and those represented by the following general formula (B):

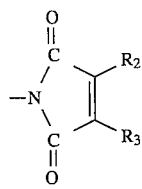

(wherein $R_2$ represents an aromatic group and $R_3$ represents a hydrogen atom, a halogen atom, an alkyl group or a cyano group) as disclosed in J.P. KOKAI Nos. Sho 49-128991, Sho 49-128992, Sho 49-128993, Sho 50- 5376, Sho 50-5377, Sho 50-5378, Sho 50-5379, Sho 50-5380, Sho 53- 5298, Sho 53-5299, Sho 53-5300, Sho 50-50107, Sho 51-47940, Sho 52- 13907, Sho 50-45076, Sho 52-121700, Sho 50-10884, Sho 50-45087 and German Patent Nos. 2,349,948 and 2,616,276. The molecular weight of these polymers is not less than 1,000 and preferably ranges from 10,000 to 200,000. These polymers have, on the side chains, at least two maleimido groups per molecule on the average.

In order to make these polymers having maleimido groups soluble in an alkaline water or swellable therewith, it is sufficient to introduce acidic groups in the polymers.

Specific examples of such acidic groups are those derived from carboxylic acid, sulfonic acid, phosphoric acid, phosphorous acid and alkali metal or ammonium salts thereof as well as those which are dissociated in the alkaline water and have a pKa value ranging from 6 to 12 and typical examples thereof are —$SO_2NHCO$—, —CONHCO—, —$SO_2NHCOO$— and a p-hydroxyphenyl group. The photocrosslinkable polymer used in the present invention can easily be prepared by copolymerizing a monomer having such an acidic group with a monomer having a maleimido group at a molar ratio ranging from 10:90 to 50:50 and preferably 20:80 to 40:60.

The acid value of the polymers carrying maleimido groups and acidic groups preferably ranges from 30 to 300 and more preferably 50 to 250. Examples of preferred such monomers carrying an acidic group copolymerizable with the monomer having a maleimido group are vinyl monomers having a carboxyl group such as acrylic acid and methacrylic acid, maleic anhydride and itaconic anhydride.

Among these polymers having the acid value defined above, useful are copolymers of N-[6-(methacryloyloxy)hexyl]-2,3-dimethylmaleimide with (meth)acrylic acid as disclosed in Die Angewandte Makromolekulare Chemie, 1984, 128, pp. 71–91. Moreover, any multi-component copolymers can easily be prepared depending on various purposes by adding a vinyl monomer as a third component to the monomer mixture during the foregoing copolymerization. For instance, flexibility can be imparted to the resulting copolymer if an alkyl methacrylate or an alkyl acrylate whose homopolymer has a glass transition temperature of not more than room temperature is used as the vinyl monomer serving as the third monomer component.

Among other photocrosslinkable polymers carrying, on the side chains or in the main chain, cinnamyl groups, cinnamoyl groups, cinnamylidene groups, cinnamylideneacetyl groups and/or chalcone groups, those having, in the main chain, the following group:

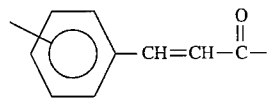

are, for instance, light-sensitive polyesters as disclosed in, for instance, U.S. Pat. No. 3,030,208 and U.S. Pat. Nos. 3,453,237 and 3,622,320. These polyesters are prepared by condensing a proper polycarboxylic acid or a proper lower alkyl ester or chloride thereof with a polyhydric alcohol in the presence of an esterification catalyst.

Examples of these photocrosslinkable polymers which are made alkaline water-soluble are light-sensitive polymers obtained by reacting a polyester prepolymer which has a photodimerizable unsaturated double bond adjacent to an aromatic nucleus on the main chain, carboxyl groups on the side chains and a hydroxyl group at the terminal with a chain extender having at least two functional groups capable of reacting with a hydroxyl group such as diisocyanate compounds, diphenyl terephthalate, diphenyl carbonate or terephthaloylbis(N-caprolactam); and light-sensitive polymers obtained by reacting a polyester prepolymer or a polyurethane prepolymer which has a photodimerizable unsaturated double bond adjacent to an aromatic nucleus in the main chain and a hydroxyl group at the terminal with a chain extender such as pyromellitic dianhydride or cyclopentanetetracarboxylic dianhydride to introduce carboxyl groups on the side chains thereof.

In addition to the foregoing examples, there may also be used, for instance, alkaline water soluble or swellable light-sensitive polymers having photodimerizable functional groups and carboxyl groups on the side chains and an acid value ranging from 20 to 200. Specific examples of these light-sensitive polymers are disclosed in, for instance, J.P. KOKAI Nos. Sho 62-175729, Sho 62-175730, Sho 63-25443, Sho 63-218944 and Sho 63-218945(U.S. Pat. No. 4,942,109 and Brit. Pat. No. 2204315).

The photocrosslinkable polymers used in the present invention desirably have a molecular weight of 1,000 or more, preferably 10,000 to 500,000 and more preferably 20,000 to 300,000.

The amount of the foregoing photocrosslinkable polymers to be added to the light-sensitive layer ranges from 10 to 99% by weight (hereinafter referred to as simply "%") and preferably 50 to 99%.

The copolycondensed diazo resins used in the present invention comprise, as structural units, those derived from an aromatic compound having at least one carboxyl group and an aromatic diazonium compound represented by the foregoing general formula (I).

A part of these diazo resins are disclosed in J.P. KOKAI Nos. Hei 1-102457 and Hei 1-254949. However, the inventions disclosed in these patents relate to a combination of a kind of diazo resin with a binder and the light-sensitive layer obtained from such a combination cannot be developed with a developer free of an organic solvent.

The foregoing aromatic compounds having at least one carboxyl group which is used in the invention are those which include, in the molecule, an aromatic ring having at least one carboxyl group. A part of the foregoing carboxyl group may be bonded to the aromatic ring.

Examples of the aromatic rings are preferably aryl group such as phenyl and naphthyl groups.

The foregoing carboxyl group may directly be bonded to an aromatic ring or may be bonded through a connecting group.

In the present invention, the number of the carboxyl groups bonded to the aromatic ring preferably ranges from 1 to 3 per aromatic ring.

Examples of the foregoing connecting groups are alkylene groups having 1 to 4 carbon atoms.

The aforementioned aromatic compounds may have at least two non-substituted positions on at least one aromatic ring of the aryl group so that the compound can be condensed with an aldehyde or a ketone.

Specific examples of the aromatic compounds having, in the molecule, at least one carboxyl group used in the present invention include salicylic acid, 4-methylsalicylic acid, 6-methylsalicylic acid, 4-ethylsalicylic acid, 6-propylsalicylic acid, 6-laurylsalicylic acid, 6-stearylsalicylic acid, 4,6-dimethylsalicylic acid, p-hydroxybenzoic acid, 2-methyl-4-hydroxybenzoic acid, 6-methyl- 4-hydroxybenzoic acid, 2,6-dimethyl-4-hydroxybenzoic acid, 2,4-dihydroxybenzoic acid, 2,4-dihydroxy-6-methylbenzoic acid, 2,6-dihydroxybenzoic acid, 2,6-dihydroxy-4-methylbenzoic acid, 4-chloro- 2,6-dihydroxybenzoic acid, 4-methoxy-2,6-dioxybenzoic acid, gallic acid, fluoroglucincarboxylic acid, 2,4,5-trihydroxybenzoic acid, m-galloylgallic acid, tannic acid, m-benzoylgallic acid, m-(p-toluyl) gallic acid, protocatechuoylgallic acid, 4,6-dihydroxyphthalic acid, (2,4-dihydroxyphenyl)acetic acid, (2,6-dihydroxyphenyl)acetic acid, (3,4,5-trihydroxyphenyl)acetic acid, p-hydroxymethylbenzoic acid, p-hydroxyethylbenzoic acid, 4-(p-hydroxyphenyl)methylbenzoic acid, 4-(o-hydroxybenzoyl)benzoic acid, 4-(2,4-dihydroxybenzoyl)benzoic acid, 4-(p-hydroxyphenoxy)benzoic acid, 4-(p-hydroxyanilino)benzoic acid, bis(3-carboxy-4-hydroxyphenyl)amine, 4-(p-hydroxyphenylsulfonyl) benzoic acid, 4-(p-hydroxyphenylthio)benzoic acid, p-methoxybenzoic acid, 2,4-dimethoxybenzoic acid, 2,4-dimethylbenzoic acid, p-phenoxybenzoic acid, p-methoxyphenylacetic acid, 4-anilinobenzoic acid, 4-(m-methoxyanilino)benzoic acid, 4-(p-methoxybenzoyl)benzoic acid, 4-(p-methylanilino)benzoic acid and 4-phenylsulfonylbenzoic acid. Among these, preferred are 2,4-dimethoxybenzoic acid, p-phenoxybenzoic acid, 4-anilinobenzoic acid, 4-(m-methoxyanilino) benzoic acid, 4-(p-methylanilino)benzoic acid, salicylic acid, p-hydroxybenzoic acid, 2,4-dihydroxybenzoic acid, gallic acid, fluoroglucincarboxylic acid, phenoxyacetic acid and 4-(p-hydroxyanilino)benzoic acid.

On the other hand, examples of the aromatic diazonium compounds used in the invention are those represented by the following general formula (I):

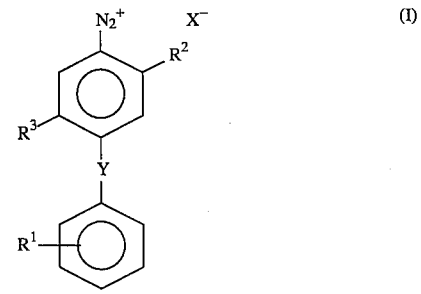

Wherein $R^1$ represents a hydrogen atom, an alkyl group, an alkoxy group, a hydroxyl group, a carboxy ester group or a carboxyl group, preferably a hydrogen atom, an alkyl group having 1 to 5 carbon atoms or a hydroxyl group; $R^2$ and $R^3$ each represents a hydrogen atom, an alkyl group or an alkoxy group, preferably a hydrogen atom.

$X^-$ represents an anion, preferably an anion derived from an inorganic or organic acid having a pKa of not more than 4. Specific examples of these acids are hydrohalogenic acids such as hydrofluoric acid, hydrochloric acid, hydrochloric acid-zinc chloride complex, hydrobromic acid; sulfuric acid, nitric acid, phosphoric acid (containing pentavalent phosphorus atom), in particular orthophosphoric acid; inorganic iso- and hetero-poly acids such as phosphotungstic acid and phosphomolybdic acid; aliphatic or aromatic phosphonic acids or half-ester thereof; arsonic acid, phosphinic acid, fluorocarboxylic acids such as trifluoroacetic acid; amidosulfonic acid, selenic acid, borofluoric acid, hexafluorophosphoric acid, perchloric acid; aliphatic and aromatic sulfonic acids such as methanesulfonic acid, fluoroalkanesulfonic acid, e.g., trifluoromethanesulfonic acid, laurylsulfonic acid, dioctylsulfosuccinic acid, dicyclohexylsulfosuccinic acid, camphorsulfonic acid, tolyloxy-3-propanesulfonic acid, nonylphenoxy-3-propanesulfonic acid, nonylphenoxy-4-butanesulfonic acid, dibutylphenoxy-3-propanesulfonic acid, diamylphenoxy-3-propanesulfonic acid, dinonylphenoxy-3-propanesulfonic acid, dibutylphenoxy-4-butanesulfonic acid, dinonylphenoxy-4-butanesulfonic acid, benzenesulfonic acid, toluenesulfonic acid, mesitylenesulfonic acid, p-chlorobenzenesulfonic acid, 2,5-dichlorobenzenesulfonic acid, sulfosalicylic acid, 2,5-dimethylbenzenesulfonic acid, p-acetylbenzenesulfonic acid, 5-nitro-o-toluenesulfonic acid, 2-nitrobenzenesulfonic acid, 3-chlorobenzenesulfonic acid, 3-bromobenzenesulfonic acid, 2-chloro-5-nitrobenzenesulfonic acid, butylbenzenesulfonic acid, octylbenzenesulfonic acid, dodecylbenzenesulfonic acid, butoxybenzenesulfonic acid, dodecyloxybenzenesulfonic acid, 2-methoxy-4-hydroxy-5-benzoylbenzenesulfonic acid, isopropylnaphthalenesulfonic acid, butylnaphthalenesulfonic acid, hexylnaphthalenesulfonic acid, octylnaphthalenesulfonic acid, butoxynaphthalenesulfonic acid, dodecyloxynaphthalenesulfonic acid, dibutylnaphthalenesulfonic acid, dioctylnaphthalenesulfonic acid, triisopropylnaphthalenesulfonic acid, tributylnaphthalenesulfonic acid, 1-naphthol-5-sulfonic acid, naphthalene-1-sulfonic acid, naphthalene-2-sulfonic acid, 1,8-dinitro-naphthalene- 3,6-disulfonic acid, 4,4'-diazidostilbene-3,3'-disulfonic acid, 1,2-naphthoquinone-2-diazido-4-sulfonic acid, 1,2-naphthoquinone- 2-diazido-5-sulfonic acid and 1,2-naphthoquinone-1-diazido- 4-sulfonic acid. $X^-$ may be a mixture of the foregoing anions.

Y represents —NH—, —O— or —S—, preferably —NH—.

Specific examples of the aromatic diazonium compounds represented by the general formula (I) include salts of 4-diazodiphenylamine, 4'-hydroxy-4-diazodiphenylamine, 4'-methyl-4-diazodiphenylamine, 4'-ethyl-4-diazodiphenylamine, 4'-n-propyl-4-diazodiphenylamine, 4'-i-propyl-4-diazodiphenylamine, 4'-n-butyl-4-diazodiphenylamine, 4'-hydroxymethyl-4-diazodiphenylamine, 4'-β-hydroxyethyl- 4-diazodiphenylamine, 4'-γ-hydroxypropyl-4-diazodiphenylamine, 4'-methoxymethyl-4-diazodiphenylamine, 4'-ethoxymethyl- 4-diazodiphenylamine, 4'-β-methoxyethyl-4-diazodiphenylamine, 4'-β -ethoxyethyl-4-diazodiphenylamine, 4'-carboxy- 4-diazodiphenylamine, 3-methyl-4-diazodiphenylamine, 3-methoxy-4-diazodiphenylamine, 3-methylamino-4-diazodiphenylamine, 3-ethyl- 4-diazodiphenylamine, 3'-methyl-4-diazodiphenylamine, 3,3'-dimethyl- 4-diazodiphenylamine, 2'-carboxy-4-diazodiphenylamine, 4-diazodiphenyl ether, 4'-methyl-4-diazodiphenyl ether, 3,4'-dimethyl-4-diazodiphenyl ether, 4'-carboxy-4-diazodiphenyl ether, 3,3'-dimethyl- 4-diazodiphenyl ether, 4-diazodiphenyl sulfide and 4'-methyl-4-diazodiphenyl sulfide. Among these, preferred are salts of 4-diazodiphenylamine and 3-methoxy-4-diazodiphenylamine.

The copolycondensed diazo resins used in the present invention which comprise, as the structural units, those derived from an aromatic compound carrying at least one carboxyl group and an aromatic diazonium compound can be prepared by a known method. For instance, they can be obtained by polycondensing an aromatic diazonium compound, an aromatic compound carrying at least one carboxyl group and an aldehyde such as paraformaldehyde, acetaldehyde or benzaldehyde, or a ketone such as acetone or acetophenone in sulfuric acid, phosphoric acid or hydrochloric acid according to a method as disclosed in Photo. Sci. Eng., 1973, 17, p. 33; or U.S. Pat. Nos. 2,063,631 and 2,679,498.

In the foregoing copolycondensation, any combination of the aromatic compounds carrying at least one carboxyl group, the aromatic diazonium compounds and aldehydes or ketones may be used and further each kind of monomeric compounds can be used alone or in combination. Moreover, the copolycondensation can be performed in the presence of phenols free of carboxyl group copolymerizable with the foregoing monomers.

In the copolycondensation, the molar ratio of the aromatic compound carrying at least one carboxyl group to the aromatic diazonium compound ranges from 1:0.1 to 0.1:1, preferably 1:0.2 to 0.2:1 and more preferably 1:0.5 to 0.2:1. In this case, the molar ratio of the sum of the aromatic compound carrying at least one carboxyl group and the aromatic diazonium compound to the aldehyde or ketone in general ranges from 1:0.6 to 1.2 and preferably 1:0.7 to 1.5 and the monomer mixture is reacted at a low temperature for a short time period, for instance, in the order of 3 hours to give a desired copolycondensed diazo resin.

Counter-anions of the copolycondensed diazo resins used in the present invention include, for instance, those which form stable salts with the copolycondensed diazo resins and make the diazo resins soluble in organic solvents. Examples of the counter-anions include those derived from organic carboxylic acids such as decanoic acid and benzoic acid; organic phosphoric acids such as phenyl phosphoric acid; and sulfonic acids. More specifically, typical examples of these organic, inorganic and sulfonic acids are hydrohalogenic acids such as hydrofluoric acid, hydrochloric acid and hydrobromic acid; sulfuric acid, nitric acid, phosphoric acid (containing pentavalent phosphorus atom), in particular orthophosphoric acid; inorganic iso- and heteropoly acids such as phosphotungstic acid and phosphomolybdic acid; aliphatic or aromatic phosphonic acids or half-ester thereof; arsonic acid, phosphinic acid, fluorocarboxylic acids such as trifluoroacetic acid; amidosulfonic acid, selenic acid, borofluoric acid, hexafluorophosphoric acid, perchloric acid; aliphatic and aromatic sulfonic acids such as methanesulfonic acid, fluoroalkanesulfonic acid, e.g., trifluoromethanesulfonic acid, laurylsulfonic acid, dioctylsulfosuccinic acid, dicyclohexylsulfosuccinic acid, camphorsulfonic acid, tolyloxy-3-propanesulfonic acid, nonylphenoxy-3-propanesulfonic acid, nonylphenoxy-4-butanesulfonic acid, dibutylphenoxy-3-propanesulfonic acid, diamylphenoxy-3-propanesulfonic acid, dinonylphenoxy-3-propanesulfonic acid, dibutylphenoxy-4-butanesulfonic acid, dinonylphenoxy-4-butanesulfonic acid, benzenesulfonic acid, toluenesulfonic acid, mesitylenesulfonic acid, p-chlorobenzenesulfonic acid, 2,5-dichlorobenzenesulfonic acid, sulfosalicylic acid, 2,5-dimethylbenzenesulfonic acid, p-acetylbenzenesulfonic acid, 5-nitro-o-toluenesulfonic acid, 2-nitrobenzenesulfonic acid, 3-chlorobenzenesulfonic acid, 3-bromobenzenesulfonic acid, 2-chloro-5-nitrobenzenesulfonic acid, butylbenzenesulfonic acid, octylbenzenesulfonic acid, dodecylbenzenesulfonic acid, butoxybenzenesulfonic acid, dodecyloxybenzenesulfonic acid, 2-methoxy-4-hydroxy- 5-benzoylbenzenesulfonic acid, isopropylnaphthalenesulfonic acid, butylnaphthalenesulfonic acid, hexylnaphthalenesulfonic acid, octylnaphthalenesulfonic acid, butoxynaphthalenesulfonic acid, dodecyloxynaphthalenesulfonic acid, dibutylnaphthalenesulfonic acid, dioctylnaphthalenesulfonic acid, triisopropylnaphthalenesulfonic acid, tributylnaphthalenesulfonic acid, 1-naphthol-5-sulfonic acid, naphthalene-1-sulfonic acid, naphthalene-2-sulfonic acid, 1,8-dinitro-naphthalene- 3,6-disulfonic acid, 4,4'-diazidostilbene-3,3'-disulfonic acid, 1,2-naphthoquinone-2-diazido-4-sulfonic acid, 1,2-naphthoquinone-2-diazido-5-sulfonic acid and 1,2-naphthoquinone-1-diazido-4-sulfonic acid; as well as a mixture of these anions. Among these anions, particularly preferred are anions of hexafluorophosphoric acid, methanesulfonic acid, dodecylbenzenesulfonic acid, dibutylnaphthalenesulfonic acid or 2-methoxy- 4-hydroxy- 5-benzoylbenzenesulfonic acid.

Specific examples of the copolycondensed diazo resins used in the present invention include salicylic acid/4-diazodiphenylamine · hexafluorophosphate/formaldehyde resin, 4-methylsalicylic acid/4-diazo- 4'-methyldiphenylamine · hexafluorophosphate/formaldehyde resin, p-hydroxybenzoic acid/4-diazodiphenylamine · hexafluorophosphate/formaldehyde resin, p-hydroxybenzoic acid/4-diazo-3-methyldiphenylamine · hexafluorophosphate/formaldehyde resin, gallic acid/4-diazo-4'-ethyldiphenylamine · 2-hydroxy-4-methoxybenzophenone- 5-sulfonic acid salt/formaldehyde resin, 2,4-dihydroxybenzoic acid/4-diazodiphenylamine · hexafluorophosphate/formaldehyde resin, 4-(p-hydroxyanilino)benzoic acid/4-diazodiphenylamine · hexafluorophosphate/formaldehyde resin, 3-methoxy-1,2-benzenedicarboxylic acid/4-diazo-3-methyldiphenylamine · hexafluorophosphate/benzaldehyde resin, p-methoxybenzoic acid/4-diazodiphenylamine · hexafluorophosphate/formaldehyde resin, 2-methylbenzoic acid/4-diazodiphenylamine · hexa-fluorophosphate/formaldehyde resin, p-phenoxybenzoic acid/4-diazodiphenylamine · 2-hydroxy-4-methoxybenzophenone-5-sulfonic acid salt/formaldehyde resin, Phenoxyacetic acid/3-methoxy-4-diazodiphenylamine · dodecylbenzene sulfonic acid/formaldehyde resin, phenoxyacetic acid/4-diazodiphenylamine · dibutyl naphthalene sulfonic acid/formaldehyde resin, 2,4-diaminobenzoic acid/4-diazodiphenylamine · hexafluorophosphate/formaldehyde resin, 2,4-dimethoxybenzoic acid/ 4-diazo-4'-methyldiphenylamine · hexafluorophosphate/formaldehyde resin, 4-carboxydiphenylamine/4-diazo-4'-ethyldiphenylamine · hexafluorophosphate/formaldehyde resin, 2,4-dimethoxybenzoic acid/4-diazodiphenylamine · hexafluorophosphate/formaldehyde resin, 4-anilinobenzoic acid/4-diazo-4'-methyldiphenylamine · hexafluorophosphate/formaldehyde resin, 4-anilinobenzoic acid/4-diazodiphenylamine · methanesulfonic acid salt/formaldehyde resin, 2,4-dihydroxybenzoic acid/4-diazodiphenylamine · dibutyl-naphthalenesulfonic acid salt/formaldehyde resin, 4-carboxydiphenylamine/4-diazodiphenylamine · methanesulfonic acid salt/formaldehyde resin and p-phenoxybenzoic acid/4-diazodiphenylamine · hexa-fluorophosphate/formaldehyde resin. Among these compounds, particularly preferred are salicylic acid/4-diazodiphenylamine · 2-hydroxy-4-methoxybenzophenone-5-sulfonic acid salt/formaldehyde resin, p-methoxybenzoic acid/4-diazodiphenylamine · hexa-fluorophosphate/formaldehyde resin, Phenoxyacetic acid/3-methoxy-4-diazodiphenylamine · dodecylbenzene sulfonic acid/formaldehyde resin, phenoxyacetic acid/4-diazodiphenylamine · dibutyl naphthalene sulfonic acid/formaldehyde resin, 2,4-diaminobenzoic acid/4-diazodiphenylamine · hexafluorophosphate/formaldehyde resin, 2,4-dimethoxybenzoic acid/4-diazodiphenylamine · 2-hydroxy-4-methoxybenzophenone-5-sulfonic acid salt/formaldehyde resin, 4-anilinobenzoic acid/4-diazodiphenylamine · methanesulfonic acid salt/formaldehyde resin, p-phenoxybenzoic acid/4-diazo-4'-methyldiphenylamine · hexafluorophosphate/formaldehyde resin, 2,4-dihydroxybenzoic acid/4-diazodiphenylamine · dibutylnaphthalenesulfonic acid salt/ formaldehyde resin, 4-carboxydiphenylamine/4-diazodiphenylamine · methanesulfonic acid salt/formaldehyde resin and 4-carboxy-4'-methoxydiphenylamine/4-diazodiphenylamine · 2-hydroxy-4-methoxybenzophenone-5-sulfonic acid salt/formaldehyde resin.

The molecular weight of the copolycondensed diazo resin used in the present invention may be arbitrarily controlled by variously adjusting the molar ratio of monomers and conditions for condensation, but it in general ranges from about 400 to 100,000 in order to effectively use the diazo resin in the intended applications and preferably ranges from about 800 to 5,000.

The light-sensitive layer may comprise the copolycondensed diazo resin in an amount ranging from 0.1 to 30% by weight, preferably 1 to 10% by weight on the basis of the total weight of the light-sensitive layer.

In addition to the copolycondensed diazo resin, the light sensitive layer may simultaneously include other diazo resins such as those disclosed in J.P. KOKOKU Nos. Sho 47-1167 and Sho 52-7364 and J.P. KOKAI Nos. Sho 50-118802 and Sho 59-222834 in an amount of not more than 50% by weight with respect to the weight of the copolycondensed diazo resin.

The light-sensitive layer used in the invention may comprise a sensitizer. As such sensitizers, preferred are triplet sensitizers having a maximum absorption so that it practically imparts, to the light-sensitive layer, sufficient light absorption at a wavelength of not less than 300 nm.

As such sensitizers, there may be mentioned, for instance, benzophenone derivatives, benzanthrone derivatives, quinones, aromatic nitro compounds, naphthothiazoline derivatives, benzothiazoline derivatives, thioxanthones, naphthothiazole derivatives, ketocoumarin derivatives, benzothiazole derivatives, naphthofuranone compounds, pyrylium salts and thiapyrylium salts. Specific examples thereof include Michler's ketones, N,N'-diethylaminobenzophenone, benzanthrone, (3-methyl-1,3-diaza-1,9-benz)anthrone picramide, 5-nitroacenaphthene, 2-chlorothioxanthone, 2-isopropylthioxanthone, dimethylthioxanthone, methylthioxanthone-1-ethylcarboxylate, 2-nitrofluorene, 2-dibenzoylmethylene-3-methylnaphthothiazoline, 3,3-carbonylbis(7-diethylaminocoumarin), 2,4,6-triphenylthiapyrylium perchlorate and 2-(p-chlorobenzoyl) naphthothiazole. The amount of the sensitizer desirably ranges from about 1 to about 20% by weight and preferably 3 to 10% by weight on the basis of the weight of the light-sensitive layer.

The light-sensitive layer may further comprise, if necessary, a binder which is in general selected from linear organic polymers. Specific examples thereof are chlorinated polyethylene, chlorinated polypropylene, poly(alkyl acrylate), copolymers of alkyl acrylates with at least one monomer selected from acrylonitrile, vinyl chloride, styrene and butadiene; polyamides, methyl cellulose, polyvinylformal, polyvinylbutyral, methacrylic acid copolymers, acrylic acid copolymers and itaconic acid copolymers.

The light-sensitive layer may, if necessary, comprise a dye or a pigment for the purpose of dyeing the layer and/or a pH indicator as a printing out agent.

The light-sensitive layer may comprise a plasticizer or the like. Examples of plasticizers usable in the invention are dialkyl phthalate such as dibutylphthalate and dihexylphthalate; oligoethylene glycol alkyl esters or phosphoric acid esters.

Moreover, the light-sensitive layer may preferably comprise a heat polymerization inhibitor and an antioxidant. Specific examples thereof effectively used are hydroquinone, p-methoxyphenol, di-t-butyl-p-cresol, pyrogallol, t-butylcatechol, benzoquinone, 4,4'-thiobis( 3-methyl-6-t-butylphenol), 2,2'-methylenebis(4-methyl-6-t-butylphenol) and 2-mercaptobenzimidazole.

The foregoing light-sensitive layer can be obtained by dissolving a light-sensitive composition which comprises the foregoing various ingredients in a proper solvent selected from the group consisting of 2-methoxyethanol, 2-methoxyethyl acetate, methyl cellosolve, propylene glycol monomethyl ether, 3-methoxypropanol, 3-methoxypropyl acetate, acetone, methyl ethyl ketone, ethylene dichloride, methyl lactate, ethyl lactate, methanol, dimethylformamide, ethanol, methyl cellosolve acetate and mixture thereof and then applying the resulting coating solution onto a substrate. The coated amount of the light-sensitive layer desirably ranges from about 0.1 to about 10 g/m$^2$, preferably 0.5 to 5 g/m$^2$ (weighed after drying).

In the present invention, an intermediate layer may be formed between the substrate and the light-sensitive layer for the purposes of improving the adhesion between the substrate and the light-sensitive layer, of preventing the light-sensitive layer from remaining unremoved on the substrate after development or of preventing halation. To improve the adhesion, the intermediate layer in general comprises, for instance, a diazo resin or a phosphoric acid compound capable of being adsorbed onto aluminum plates. In addition, the intermediate layer in general comprises a substance having a high solubility such as polymers having a high solubility in developers or water-soluble polymers so that the light-sensitive layer does not remain after development. Moreover, the intermediate layer generally comprises a dye or a UV absorber in order to prevent halation. The thickness of the intermediate layer is not restricted to a specific range, but should be one which makes it possible to cause a reaction for forming uniform bonds between the intermediate layer and the light-sensitive layer. In general, the coated amount thereof ranges from about 1 to 100 mg/m$^2$, in particular 5 to 40 mg/m$^2$ (expressed in terms of the dry solid contents).

The intermediate layer may comprise the copolycondensed diazo resin in an amount ranging from 30 to 100% by weight and preferably 60 to 100% by weight on the basis of the total weight of the intermediate layer.

The intermediate layer may further comprise, if necessary, a sensitizer, a stabilizer for the diazo resin, a polymeric binder, a halation-inhibitory agent and a surfactant as well as other various additives.

The intermediate layer can be obtained by dissolving the foregoing compound in an appropriate solvent at a desired concentration, coating the resulting solution onto a substrate or immersing the substrate in the resultant solution and then drying the layer applied.

The substrates having a hydrophilic surface usable in the present invention is desirably a plate-like substance having high dimensional stability. Such dimensionally stable plate-like substances include, for instance, those conventionally used as substrates for printing materials and they can be suitably employed in the present invention. Typical examples of such substrates are paper, paper laminated with a plastic film such as a polyethylene, polypropylene or polystyrene film; a metal plate such as an aluminum (inclusive of an aluminum alloy), zinc or copper plate; a plastic film such as a cellulose diacetate, cellulose triacetate, cellulose propionate, cellulose acetate, cellulose acetate butyrate, cellulose nitrate, polyethylene terephthalate, polyethylene, polystyrene, polypropylene, polycarbonate or polyvinylacetal film; and paper or a plastic film which is laminated with a foil of the foregoing metal or on which a layer of the foregoing metal is deposited. Among these substrates, preferred are those formed from aluminum because of their high dimensional stability, low cost and good adhesion to the light-sensitive layer or the like used in the invention. Besides, a composite sheet which comprises a polyethylene terephthalate film bonded with an aluminum sheet as disclosed in J.P. KOKOKU No. Sho 48-18327 is also preferably used in the invention.

In the case of metal substrates, in particular, aluminum substrates, they are preferably subjected to a surface treatment such as a graining or anodization treatment.

The aluminum substrates are preferably dipped in an aqueous solution of sodium silicate, potassium fluorozirconate or a phosphoric acid salt for enhancing the hydrophilicity thereof. Preferably used further include, for instance, aluminum plates which are grained and then immersed in an aqueous solution of sodium silicate as disclosed in U.S. Pat. No. 2,714,066; and those anodized and then dipped in an aqueous solution of an alkali metal silicate as disclosed in J.P. KOKOKU No. Sho 47-5125.

It is also effective to subject aluminum substrates to silicate electrodeposition as disclosed in U.S. Pat. No. 3,658,662.

Moreover, it is likewise effective to adopt a combination of electrolytic graining, the aforementioned anodization and a sodium silicate treatment as disclosed in J.P. KOKOKU No. Sho 46-27481 and J.P. KOKAI Nos. Sho 52-58602 and Sho 52-30503.

Preferred aluminum substrates further include those which are subjected, in order, to brush graining, electrolytic graining, anodization and sodium silicate treatments. Those obtained by applying an underlying coating layer onto the aluminum substrates thus treated are also preferred. The underlying layer may comprise a water-soluble resin such as polyvinyl phosphonic acid, polymers and copolymers having, on the side chains, sulfonic acid groups and polyacrylic acid.

These hydrophilization treatments are performed not only for making the surface of the substrate hydrophilic but also for preventing the occurrence of any detrimental reaction with the light-sensitive composition applied thereon and for enhancing the adhesion thereof to the light-sensitive layer.

The PS plate of the present invention is imagewise exposed to light from a light source rich in ultraviolet rays such as a metal halide lamp or a high pressure mercury lamp, then treated with a developer to remove the un-exposed areas of the light-sensitive layer and finally coated with a gumming up solution to thus give a lithographic printing plate.

Examples of developer which can be used for developing the PS plate of the invention preferably include an aqueous solution containing an inorganic alkaline agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia. The inorganic alkaline agent is used in the developers in an amount of 0.1 to 10% by weight, preferably 0.5 to 5% by weight.

These alkaline aqueous solution may comprise, if necessary, a surfactant and/or an organic solvent such as an alcohol. Preferred examples of the organic solvents are benzyl alcohol, 2-phenoxyethanol, 2-butoxyethanol and n-propyl alcohol. In addition, it is also preferred to add, to the developer solutions, an agent for solubilizing the diazo resin and/or a reducing substance such as sulfites, methylresorcin or pyrazolone compounds.

In addition to the developers listed above, those disclosed in U.S. Pat. Nos. 3,615,480 and 3,475,171 and those disclosed in J.P. KOKAI No. Sho 50-26601 and J.P. KOKOKU Nos. Sho 56-39464 and Sho 56-42860 are effectively used for developing the PS plates of the present invention.

The present invention will hereunder be explained in more detail with reference to the following non-limitative working Examples and Preparation Examples and further the effect practically achieved by the present invention will also be discussed in comparison with Comparative Examples given below.

In the following description, the term "%" means "% by weight" unless otherwise specified.

Preparation Example 1

3.8 g (0.025 mole) of p-methoxybenzoic acid and 21 g (0.075 mole) of 4-diazodiphenylamine sulfate were dissolved in 90 g of conc. sulfuric acid while cooling with water. Then 2.7 g (0.09 mole) of paraformaldehyde was slowly added to the resulting solution. The addition of paraformaldehyde was performed while controlling the temperature to a level of not more than 10° C. Thereafter, the reaction system was stirred for 2 hours with ice-cooling. This reaction mixture was poured in 1 l of ethanol and the precipitates formed were removed by filtration. The precipitates were washed with ethanol, dissolved in 200 ml of pure water and then 10.5 g of a cold concentrated aqueous solution of zinc chloride was added to the solution. The resulting precipitates were filtered off, then washed with ethanol and dissolved in 300 ml of pure water. To the solution there was added a cold concentrated solution of 13.7 g of ammonium hexafluorophosphate in water. The precipitates formed were filtered off, washed with water and dried at 30° C. for a whole day and night to give a copolycondensed diazo resin-I.

The molecular weight of the copolycondensed diazo resin-I was determined by the gel permeation chromatography (GPC) technique and was found to be about 2,400 expressed in the weight average molecular weight.

Other copolycondensed diazo resins usable in the present invention can be prepared in the same manner as described in Preparation Example 1.

Example 1

The surface of an aluminum plate having a thickness of 0.30 mm was grained with a nylon brush and an aqueous suspension of 400 mesh pumice stone and then sufficiently washed with water. The aluminum plate was etched by immersing in a 10% aqueous solution of sodium hydroxide at 70° C. for 60 seconds, then washed with running water, neutralized and washed with a 20% nitric acid solution and washed with water. The aluminum plate was then subjected to an electrolytic surface graining treatment in a 1% nitric acid solution utilizing a sinusoidal alternating wave current at an anode time voltage ($V_A$) of 12.7V and a quantity of anode time electricity of 160 coulomb/dm². At this stage, the surface roughness of the resulting aluminum plate was determined and found to be 0.6μ (expressed in terms of Ra unit). Subsequently, the plate was desmutted by immersing in a 30% aqueous solution of sulfuric acid at 55° C. for 2 minutes and then anodized at a current density of 2 A/dm² in a 20% aqueous solution of sulfuric acid so that the thickness of the resulting anodized layer was 2.7 g/m². Thereafter, the aluminum plate was immersed in a 2.5% aqueous solution of sodium silicate maintained at 70° C. for one minute, washed with water and then dried.

A light-sensitive composition I detailed below was prepared.

| Light-sensitive Composition I | |
|---|---|
| Component | Amount (g) |
| methyl methacrylate/N-(2-(methacryloyloxy)ethyl)-2,3-dimethylmaleimide/methacrylic acid (molar ratio =10/60/30) copolymer | 5 |
| sensitizer represented by the following structural formula | 0.25 |

-continued

| Light-sensitive Composition I | |
|---|---|
| Component | Amount (g) |

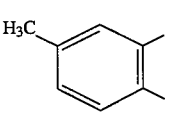

| copolycondensed diazo resin-I (Preparation Example 1) | 0.10 |
| propylene glycol monomethyl ether | 50 |
| methyl ethyl ketone | 50 |
| Megafac F-177 (fluorine atom-containing nonionic surfactant; available from DAINIPPON INK AND CHEMICALS, INC.) | 0.03 |
| Cu-phthalocyanine pigment (CI Pigment Blue 15) (containing 10% plasticizer dispersed therein) | 1.0 |

This light-sensitive composition was applied onto the surface of the aluminum substrate treated above with a whirler so that the coated amount thereof was 1.2 g/m² (weighed after drying) and then dried at 80° C. for 2 minutes to give a PS plate (A).

Comparative Example 1

A PS plate (B) was prepared in the same manner used in Example 1 except that the foregoing light-sensitive composition I from which the copolycondensed diazo resin was omitted was employed.

Comparative Example 2

A PS plate (C) was prepared in the same manner used in Example 1 except that a conventionally known diazo resin (a) was substituted for the copolycondensed diazo resin-I in the light-sensitive composition I.

Diazo Resin (a)

Hexafluorophosphate ($PF_6$ salt) of a condensate of p-diazodiphenylamine with formaldehyde.

A step wedge (a density difference of 0.15 and the number of steps of 15) and a negative original carrying half tone dot images were closely put on each PS plate (A) to (C) obtained above, then the PS plate was imagewise exposed to light from a 2KW super high pressure mercury lamp for 60 seconds and was immersed in a 5% by weight aqueous solution of sodium silicate for about one minute to develop the plate.

After washing with water and drying the imagewise exposed and developed PS plate, each resulting lithographic printing plate (A) to (C) was subjected to printing operation with KOR-D Type Printing Press (available from Heidelberg Co., Ltd.).

The sensitivity of these PS plates and the printing quality of the resulting lithographic printing plates are summarized in the following Table I.

TABLE I

| Printing Plate | Sensitivity Max. No. of Step Wedge | Resistance to Defects During Development | Printing Quality | |
|---|---|---|---|---|
| | | | Durability | Contamination |
| (A) | 10 | good | 60,000 | o |
| (B) | 7 | defects on image areas | 30,000 | o |
| (C) | 10 | good | 60,000 | x |

TABLE I-continued

| | Sensitivity | Resistance to | Printing Quality | |
|---|---|---|---|---|
| Printing Plate | Max. No. of Step Wedge | Defects During Development | Durability | Contamination | o: no background contamination
x: background contamination was observed.

As seen from the results listed in Table I, the PS plate (A) of the present invention is excellent in sensitivity and the printing plate obtained from the PS plate (A) also has excellent printing quality as compared with those for Comparative Examples.

Example 2

A PS plate (D) was prepared, in the same manner used in Example 1, by applying the following light-sensitive composition II onto the surface of an aluminum substrate and then drying.

| Light-sensitive Composition II | |
|---|---|
| Component | Amount (g) |
| N-(6-(methacryloyloxy)hexyl)-2,3-dimethyl-maleimide/methacrylic acid (molar ratio = 65/35) copolymer | 5 |
| sensitizer represented by the following structural formula: | 0.3 |

| | |
|---|---|
| dodecylbenzenesulfonate of co-polycondensate of 4-diazodiphenyl-amine.phenoxyacetic acid and formaldehyde (copolycondensed diazo resin-II; prepared in the same manner as in Preparation Example 1; weight average molecular weight = 2,100) | 0.10 |
| dipicolinic acid | 0.05 |
| propylene glycol monomethyl ether | 50 |
| methyl ethyl ketone | 50 |
| Megafac F-177 | 0.03 |
| Oil Blue #603 (available from ORIENT CHEMICAL INDUSTRIES, LTD.) | 0.15 |

Comparative Example 3

A PS plate (E) was prepared in the same manner used in Example 2 except that the light-sensitive composition II from which the copolycondensed diazo resin was omitted was used.

As in Example 1, each PS plate (D) to (E) was imagewise exposed and developed and the resulting lithographic printing plate was subjected to printing operation. The results obtained are listed in the following Table II.

TABLE II

| | Sensitivity | Resistance to | Printing Quality | |
|---|---|---|---|---|
| Printing Plate | Max. No. of Step Wedge | Defects During Development | Durability | Contamination |
| (D) | 11.0 | good | 60,000 | None |
| (E) | 6.0 | defects were | 30,000 | None |

TABLE II-continued

| | Sensitivity | Resistance to | Printing Quality | |
|---|---|---|---|---|
| Printing Plate | Max. No. of Step Wedge | Defects During Development | Durability | Contamination |
| | | observed | | |

Example 3

An aluminum plate was treated in the same manner as in Example 1 and a solution of the following copolycondensed diazo resin was prepared.

| | |
|---|---|
| Diazo resin-II | 0.1 g |
| methanol | 180 g |
| pure water | 20 g |

The solution was applied onto the surface of the aluminum substrate with a whirler so that the coated amount thereof (weighed after drying) was 10 mg/m$^2$ and then dried at 80° C. for one minute to form an intermediate layer.

Then the following light-sensitive composition III was prepared:

| Light-sensitive Composition III | |
|---|---|
| Component | Amount (g) |
| β-cinnamoyloxyethyl methacrylate/methacrylic acid (molar ratio = 70/30) copolymer | 5.0 |
| sensitizer having the following structural formula: | 0.4 |

| | |
|---|---|
| diethyl phthalate | 0.5 |
| Cu-phthalocyanine pigment (CI Pigment Blue 15) (10% solution of pigment in plasticizer) | 1.0 |
| F-177 (fluorine atom-containing surfactant; available from DAINIPPON INK AND CHEMICALS, INC.) | 0.02 |
| methyl ethyl ketone | 20 |
| methanol | 2 |
| propylene glycol monomethyl ether | 28 |

This light-sensitive composition III was applied onto the aluminum substrate provided thereon with the intermediate layer with a whirler so that the coated amount thereof was 1.0 g/m$^2$ (weighed after drying) and then dried at 80° C. for 2 minutes to give a PS plate (F).

Comparative Example 4

A PS plate (G) was prepared in the same manner used in Example 3 except that dodecylbenzenesulfonate of a condensate of 4-diazodiphenylamine and formaldehyde was substituted for the copolycondensed diazo resin-II in the solution of copolycondensed diazo resin. Moreover, the same procedures used in Example 3 were repeated except that the copolycondensed diazo resin solution from which the copolycondensed diazo resin was omitted was employed to obtain a PS plate (H).

As in Example 1, each PS plate (F) to (H) was imagewise exposed and developed and the resulting lithographic printing plate was subjected to printing operation. The results obtained are listed in the following Table III.

TABLE III

| Printing Plate | Sensitivity Max. No. of Step Wedge | Resistance to Defects During Development | Printing Quality | |
|---|---|---|---|---|
| | | | Durability | Contamination |
| (F) | 9.0 | good | 40,000 | o |
| (G) | 9.0 | good | 40,000 | x |
| (H) | 5.0 | defects were observed | 20,000 | o | o: no background contamination
x: background contamination was observed.

As seen from the results listed in Table III, the PS plate (F) of the present invention has high sensitivity and the lithographic printing plate obtained from the PS plate (F) does not cause background contamination during printing and has sufficient printing durability as compared with those for Comparative Examples.

What is claimed is:

1. A process for preparing a lithographic priming plate which comprises the steps of providing a presensitized plate comprised of a substrate having a hydrophilic surface provided thereon with a light-sensitive layer containing an alkaline water-soluble or swellable photocrosslinkable polymer having photodimerizable unsaturated double bonds wherein the light-sensitive layer contains a copolycondensed diazo resin having, as structural units, units derived from an aromatic compound having at least one carboxyl group and units derived from an aromatic diazonium compound represented by the following general formula (I):

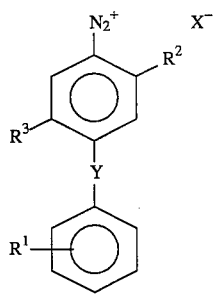

wherein $R^1$ represents a hydrogen atom, an alkyl group, an alkoxy group, a hydroxy group, a carboxy ester group or a carboxyl group; $R^2$ and $R^3$ each represents a hydrogen atom, an alkyl group or an alkoxy group; $X^-$ represents an anion; and Y represents —NH—, —O— or —S— wherein the light-sensitive layer is composed so as to be capable of being developed in an aqueous alkaline solution free from an organic solvent; imagewise exposing the presensitized plate and developing the presensitized plate with an aqueous alkaline solution free from an organic solvent so as to remove non-image areas of the light-sensitive layer.

2. The process of claim 1 wherein said alkaline solution contains an inorganic alkaline agent selected from the group consisting of sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia.

3. The process of claim 1 wherein the presensitized plate further comprises at least one of an intermediate layer between the substrate and the light-sensitive layer and the light-sensitive layer and the intermediate layer comprises the copolycondensed diazo resin.

4. The process of claim 3 wherein the aromatic compound having at least one carboxyl group includes, in the molecule, an aromatic ring having at least one carboxyl group, provided that a part of the carboxyl group may be bonded to the aromatic ring directly or through an alkylene group having 1 to 4 carbon atoms.

5. The process of claim 4 wherein the aromatic ring is an aryl groups and the number of carboxyl groups bonded to the aromatic group ranges from 1 to 3.

6. The process of claim 3 wherein the molecular weight of the copolycondensed diazo resin ranges from about 400 to 100,000.

7. The process of claim 6 wherein the molecular weight of the copolycondensed diazo resin ranges from about 800 to 5,000.

8. The process of claim 3 wherein the light-sensitive layer comprises the copolycondensed diazo resin in an amount ranging from 1 to 10% by weight on the basis of the total weight of the light-sensitive layer.

9. The process of claim 3 wherein the intermediate layer comprises the copolycondensed diazo resin in an amount ranging from 60 to 100% by weight on the basis of the total weight of the intermediate layer.

10. The process of claim 1 wherein the aromatic compound having, in the molecule, at least one carboxyl group is selected from the group consisting of salicylic acid, 4-methylsalicylic acid, 6-methylsalicylic acid, 4-ethylsalicylic acid, 6-propylsalicylic acid, 6-1aurylsalicylic acid, 6-stearylsalicylic acid, 4,6-dimethylsalicylic acid, p-hydroxybenzoic acid, 2-methyl-4-hydroxybenzoic acid, 6-methyl-4-hydroxybenzoic acid, 2,6-dimethyl-4-hydroxybenzoic acid, 2,4-dihydroxybenzoic acid, 2,4-dihydroxy-6-methylbenzoic acid, 2,6-dihydroxybenzoic acid, 2,6-dihydroxy-4-methylbenzoic acid, 4-chloro-2,6-dihydroxybenzoic acid, 4-methoxy-2,6-dioxybenzoic acid, gallic acid, fluoroglucincarboxylic acid, 2,4,5-trihydroxybenzoic acid, m-galloylgallic acid, tannic acid, m-benzoylgallic acid, m-(p-toluyl)gallic acid, protocatechuoylgallic acid, 4,6-dihydroxyphthalic acid, (2,4-dihydroxyphenyl)aceticacid, (2,6-dihydroxyphenyl)aceticacid, (3,4,5-trihydroxyphenyl)acetic acid, p-hydroxymethylbenzoic acid, p-hydroxyethylbenzoic acid, 4-(p-hydroxyphenyl)methylbenzoic acid, 4-(o-hydroxybenzoyl)benzoic acid, 4-(2,4-dihydroxybenzoyl)benzoic acid, 4-(p-hydroxyphenoxy)benzoic acid, 4-(p-hydroxyanilino)benzoic acid, bis(3-carboxy-4-hydroxyphenyl)amine, 4-(p-hydroxyphenylsulfonyl)benzoicacid, 4-(p-hydroxyphenylthio)benzoicacid, p-methoxybenzoic acid, 2,4-dimethoxybenzoic acid, 2,4-dimethylbenzoic acid, p-phenoxybenzoic acid, phenoxyacetic acid, p-methoxyphenylacetic acid, 4-anilinobenzoic acid, 4-(m-methoxyanilino)benzoic acid, 4-(p-methoxybenzoyl)benzoic acid, 4-(p-methylanilino)benzoic acid and 4-phenylsulfonylbenzoic acid.

11. The process of claim 10 wherein the aromatic compound having at least one carboxyl group is at least one member selected from the group consisting of 2,4-dimethoxybenzoic acid, p-phenoxybenzoic acid, 4-anilinobenzoic acid, 4-(m-methoxyanilino) benzoic acid, 4-(p-methylanilino)benzoic acid, salicylic acid, p-hydroxybenzoic acid, 2,4-dihydroxybenzoic acid, gallic acid, fluoroglucincarboxylic acid, phenoxyacetic acid and 4-(p-hydroxyanilino)benzoic acid.

12. The process plate of claim 1 wherein the aromatic diazonium compound is selected from the group consisting of compounds represented by the general formula:

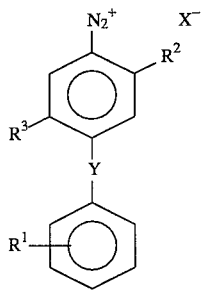

wherein $R^1$ represents a hydrogen atom, an alkyl group having 1 to 5 carbon atoms or a hydroxyl group; $R^2$ and $R^3$ each represents a hydrogen atom, $X^-$ represents an anion derived from an inorganic or organic acid having a pKa of not more than 4 and Y represents —NH—.

13. The process of claim 1 wherein the aromatic diazonium compound represented by the general formula (I) is selected from the group consisting of salts of 4-diazodiphenylamine, 4'-hydroxy-4-diazodiphenylamine, 4'-methyl-4-diazodiphenylamine, 4'-ethyl-4-diazodiphenylamine, 4'-n-propyl-4-diazodiphenylamine, 4'-i-propyl-4-diazodiphenylamine, 4'-n-butyl-4-diazodiphenylamine, 4'-hydroxymethyl-4-diazodiphenylamine, 4'-β-hydroxyethyl-4-diazodiphenylamine, 4'-γ-hydroxypropyl-4-diazodiphenylamine, 4'-methoxymethyl-4-diazodiphenylamine, 4'-ethoxymethyl-4-diazodiphenylamine, 4'-β-methoxyethyl-4-diazodiphenylamine, 4'-β-ethoxyethyl-4-diazodiphenylamine, 4'-carboxy-4-diazodiphenylamine, 3-methoxy-4-diazodiphenylamine, 3-methylamino-4-diazodiphenylamine, 3-methyl-4-diazodiphenylamine, 3-ethyl-4-diazodiphenylamine, 3'-methyl-4-diazodiphenylamine, 3,3'-dimethyl-4-diazodiphenylamine, 2'-carboxy-4-diazodiphenylamine, 4-diazodiphenyl ether, 4'-methyl-4-diazodiphenyl ether, 3,4'-dimethyl-4-diazodiphenyl ether, 4'-carboxy-4-diazodiphenyl ether, 3,3'-dimethyl-4-diazodiphenyl ether, 4-diazodiphenyl sulfide and 4'-methyl-4-diazodiphenyl sulfide.

14. The process of claim 13 wherein the aromatic diazonium compound represented by the general formula (I) is selected from the group consisting of salts of 4-diazodiphenylamine and 3-methoxy-4-diazodiphenylamine.

15. The process of claim 1 wherein the copolycondensed diazo resin is a resin obtained by copolycondensing an aromatic diazonium compound, an aromatic compound carrying at least one carboxyl group and an aldehhyde or a ketone in sulfuric acid, phosphoric acid or hydrochloric acid.

16. The process of claim 15 wherein in the copolycondensation, the molar ratio of the aromatic compound carrying at least one carboxyl group to the aromatic diazonium compound ranges from 1:0.1 to 0.1:1 and the molar ratio of the sum of the aromatic compound carrying at least one carboxyl group and the aromatic diazonium compound to the aldehyde or ketone ranges from 1:0.6 to 1.2.

17. The process of claim 16 wherein in the copolycondensation, the molar ratio of the aromatic compound carrying at least one carboxyl group to the aromatic diazonium compound ranges from 1:0.2 to 0.2:1 and the molar ratio of the sum of the aromatic compound carrying at least one carboxyl group and the aromatic diazonium compound to the aldehyde or ketone ranges from 1:0.7 to 1.5.

18. The process of claim 1 wherein the anion of the copolycondensed diazo resin is selected from the group consisting of anions derived from hydrofluoric acid, hydrochloric acid, hydrobromic acid, sulfuric acid, nitric acid, orthophosphoric acid, phosphotungstic acid, phosphomolybdic acid, aliphatic or aromatic phosphonic acids or half-ester thereof, arsonic acid, phosphinic acid, fluorocarboxylic acids, amidosulfonic acid, selenic acid, borofluoric acid, hexafluorophosphoric acid, perchloric acid, methanesulfonic acid, fluoroalkanesulfonic acid, laurylsulfonic acid, dioctylsulfosuccinic acid, dicyclohexylsulfosuccinic acid, camphorsulfonic acid, tolyloxy-3-propanesulfonic acid, nonylphenoxy-3-propanesulfonicacid, nonylphenoxy-4-butanesulfonicac id, dibutylphenoxy- 3-propanesulfonic acid, diamylphenoxy-3-propanesulfonic acid, dinonylphenoxy-3-propanesulfonicacid, dibutylphenoxy-4-butanesulfonicacid, dinonylphenoxy-4-butanesulfonic acid, benzenesulfonic acid, toluenesulfonic acid, mesitylenesulfonic acid, p-chlorobenzenesulfonic acid, 2,5-dichlorobenzenesulfonic acid, sulfosalicylic acid, 2,5-dimethylbenzenesulfonic acid, p-acetylbenzenesulfonic acid, 5-nitro-o-toluenesulfonic acid, 2-nitrobenzenesulfonic acid, 3-chlorobenzenesulfonic acid, 3-bromobenzenesulfonic acid, 2 -chloro-5-nitrobenzenesulfonic acid, butylbenzenesulfonic acid, octylbenzenesulfonic acid, dodecylbenzenesulfonic acid, butoxybenzenesulfonic acid, dodecyloxybenzenesulfonic acid, 2-methoxy-4-hydroxy-5-benzoylbenzenesulfonic acid, isopropylnaphthalenesulfonic acid, butylnaphthalenesulfonic acid, hexylnaphthalenesulfonic acid, octylnaphthalenesulfonic acid, butoxynaphthalenesulfonic acid, dodecyloxynaphthalenesulfonic acid, dibutylnaphthalenesulfonic acid, dioctylnaphthalenesulfonic acid, triisopropylnaphthalenesulfonic acid, tributylnaphthalenesulfonic acid, 1-naphthol-5-sulfonic acid, naphthalene-1-sulfonic acid, naphthalene-2-sulfonic acid, 1,8-dinitronaphthalene-3,6-disulfonic acid, 4,4'-diazidostilbene-3,3'-disulfonic acid, 1,2-naphthoquinone-2-diazido-4 -sulfonic acid, 1,2-n-aphthoquinone-2-diazido-5-sulfonic acid and 1,2-naphthoquinone-1 -diazido-4-sulfonic acid.

19. The process of claim 1 wherein the copolycondensed diazo resin is a member selected from the group consisting of salicylic acid/4-diazodiphenylamine · 2-hydroxy-4 -methoxybenzophenone-5-sulfonic acid salt/formaldehyde resin, p-methoxybenzoic acid/4-diazodiphenylamine · hexafluorophosphate/formaldehyde resin, phenoxyacetic acid/3-methoxy- 4-diazodiphenylamine · dodecylbenzene sulfonic acid/formaldehyde resin, phenoxyacetic acid/4-diazodiphenylamine · dibutyl naphthalene sulfonic acid/formaldehyde resin, 2,4-dimethoxybenzoic acid/4-diazodiphenylamine · 2-hydroxy-4 -methoxybenzophenone-5-sulfonic acid salt/formaldehyde resin, 4-anilinobenzoic acid/4-diazodiphenylamine · methanesulfonic acid salt/formaldehyde resin, p-phenoxybenzoic acid/4-diazo-4'-methyldiphenylamine · hexafluorophosphate/formaldehyde resin, 2,4-dihydroxybenzoic acid/4-diazodiphenylamine · dibutylnaphthalenesulfonic acid salt/formaldehyde resin, 4-carboxydiphenylamine/4-diazodiphenylamine · methanesulfonic acid salt/formaldehyde resin and 4-carboxy-4'-methoxydiphenylamine/4-diazodiphenylamine · 2-hydroxy-4-methoxybenzophenone-5-sulfonic acid salt/formaldehyde resin.

20. The process of claim 1 wherein the photocrosslinkable polymer is selected from polymers carrying, on the side chains, maleimido groups represented by the following general formula (A):

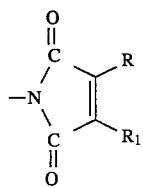

and the acid value of 50 to 250.

21. The process of claim 20 wherein the photocrosslinkable polymer is a copolymer of N-[6-(methacryloyloxy)hexyl]-2, 3-dimethylmaleimide with methacrylic acid.

22. The process of claim 1 wherein the aqueous alkaline solution contains a surfactant.

23. The process of claim 1 wherein the aqueous alkaline solution contains a reducing agent.

24. The process of claim 23 wherein the reducing agent is selected from the group consisting of sulfites, methylresorcin and pyrazolone compounds.

* * * * *

UNITED STATES PATENT AND TRADEMARK OFFICE
CERTIFICATE OF CORRECTION

PATENT NO. : 5,476,754
DATED : December 19, 1995
INVENTOR(S) : Masanori IMAI et al It is certified that error appears in the above-indentified patent and that said Letters Patent is hereby corrected as shown below:

<u>ON THE TITLE PAGE</u>
In Section [21], delete "388,576" and insert -- 388,575 --.

Signed and Sealed this

Twentieth Day of February, 1996

Attest:

BRUCE LEHMAN

*Attesting Officer*     *Commissioner of Patents and Trademarks*